(12) United States Patent
Yang et al.

(10) Patent No.: US 11,656,305 B2
(45) Date of Patent: May 23, 2023

(54) MRI SADDLE BASED FLEXIBLE ARRAY COIL

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Joshua Robert Reiderman, Akron, OH (US); Matthew Finnerty, University Heights, OH (US); David Michael Berendt, Aurora, OH (US); John Thomas Carlon, Perry, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 0 days.

(21) Appl. No.: 17/464,951

(22) Filed: Sep. 2, 2021

(65) Prior Publication Data

US 2022/0120831 A1 Apr. 21, 2022

Related U.S. Application Data

(60) Provisional application No. 63/093,874, filed on Oct. 20, 2020.

(51) Int. Cl.
*G01R 33/3415* (2006.01)
*G01R 33/34* (2006.01)

(52) U.S. Cl.
CPC ... *G01R 33/3415* (2013.01); *G01R 33/34084* (2013.01); *G01R 33/34007* (2013.01)

(58) Field of Classification Search
CPC .......... G01R 33/3415; G01R 33/34084; G01R 33/34007; G01R 33/365
See application file for complete search history.

(56) References Cited

U.S. PATENT DOCUMENTS

| 4,825,162 A | 4/1989 | Roemer et al. | |
| 5,548,218 A * | 8/1996 | Lu | G01R 33/34084 |
| | | | 324/318 |
| 5,682,098 A * | 10/1997 | Vij | G01R 33/3415 |
| | | | 324/318 |
| 2004/0196042 A1 * | 10/2004 | Fujita | G01R 33/3415 |
| | | | 324/318 |

(Continued)

FOREIGN PATENT DOCUMENTS

DE 19505062 A1 * 10/1996 ......... G01R 33/3415

OTHER PUBLICATIONS

Machine Translation of DE-19505062-A1, (Year: 1996).*

(Continued)

*Primary Examiner* — G. M. A Hyder
(74) *Attorney, Agent, or Firm* — Eschweiler & Potashnik, LLC

(57) ABSTRACT

In some embodiments, the present disclosure relates to a flexible magnetic resonance imaging (MRI) radio frequency (RF) array coil configured to operate in at least one of a transmit (Tx) mode or a receive (Rx) mode. The MRI RF array coil includes a first row of saddle coil elements. At least a first saddle coil element and a second saddle coil element are in the first row. The first and second saddle coil elements partially overlap with one another. Each of the first and second saddle coil elements include a left loop and a right loop that is coupled to the left loop by two connection segments.

20 Claims, 10 Drawing Sheets

(56) References Cited

U.S. PATENT DOCUMENTS

2020/0408860 A1* 12/2020 Taracila ............. G01R 33/3415

OTHER PUBLICATIONS

Wang, Jianmin. "A Novel Method to Reduce the Signal Coupling of Surface Coils for MRI." Proc. ISMRM 4:1434 (1996), published in 1996.
Hornak, Joseph. "The Basics of MRI. Chapter 9: Imaging Hardware." Interactive Learning Software, Henrietta, NY, 2012, http://www.cis.rit.edu/htbooks/mri/. Published in 2012.
Questions & Answers in MRI. "Radiofrequency Coils: What are the function(s) of radiofrequency (RF) coils?" The date of publication is unknown. Retrieved online on Aug. 3, 2021 from https://mriquestions.com/rf-coil-functions.html.
Roemer et al. "The NMR Phased Array" Magnetic Resonance in Medicine 16, 192-225 (1990), published in 1990.

* cited by examiner

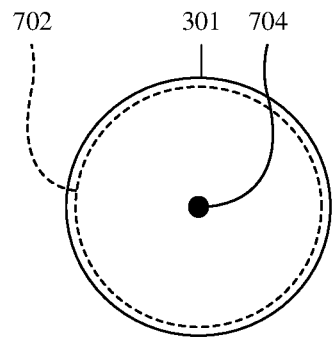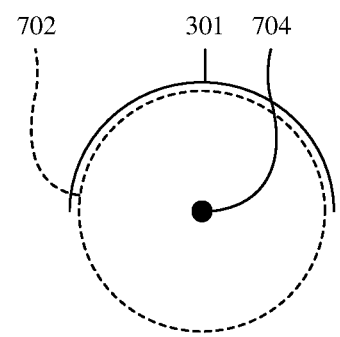
Fig. 7A                Fig. 7B
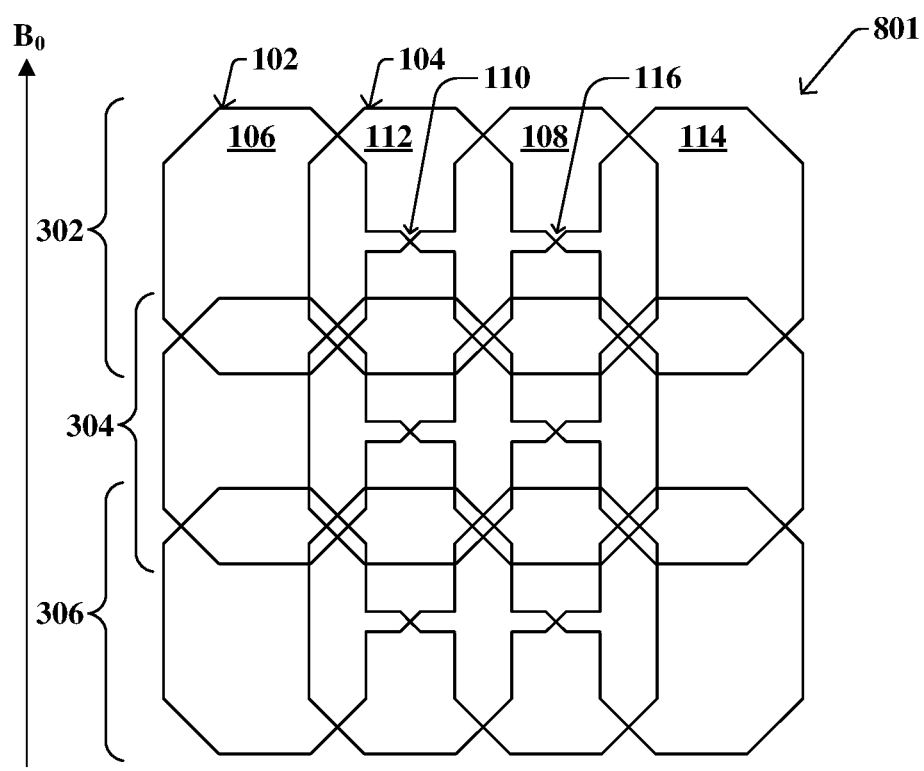
Fig. 8

1500

```
┌─────────────────────────────────────────────────────────────────────────┐
│ Provide a saddle based flexible array coil comprising: a first row of at least two saddle coil │ ─1502
│ elements that overlap one another in a lateral or circumferential direction, wherein the first │
│         row is configured to function in transmit and/or receive mode                          │
└─────────────────────────────────────────────────────────────────────────┘
                                         ↓
┌─────────────────────────────────────────────────────────────────────────┐
│ Performing an MRI imaging process using the saddle based flexible array coil, wherein the      │
│ orientation and structure of the at least two saddle coil elements reduce noise to improve     │ ─1504
│ reliability of the MRI imaging process, and wherein the MRI imaging process comprises:         │
│                                                                                                │
│    ┌──────────────────────────────────────────────────────────────────┐                        │
│    │ Arrange a scan object in or proximate to the saddle based flexible array coil │ ─1506     │
│    └──────────────────────────────────────────────────────────────────┘                        │
│                                         ↓                                                      │
│    ┌──────────────────────────────────────────────────────────────────┐                        │
│    │ Apply a $B_0$ magnetic field to the scan object to align nuclei spinning in the │ ─1508   │
│    │                  scan object to the $B_0$ magnetic field                        │         │
│    └──────────────────────────────────────────────────────────────────┘                        │
│                                         ↓                                                      │
│    ┌──────────────────────────────────────────────────────────────────┐                        │
│    │ Apply gradient fields to the scan object to select a portion of the scan object │ ─1510   │
│    └──────────────────────────────────────────────────────────────────┘                        │
│                                         ↓                                                      │
│    ┌──────────────────────────────────────────────────────────────────┐                        │
│    │ Apply a $B_1$ magnetic field to the scan object, wherein the $B_1$ magnetic field │ ─1512 │
│    │                    excites nuclei of the selected portion                        │       │
│    └──────────────────────────────────────────────────────────────────┘                        │
│                                         ↓                                                      │
│    ┌──────────────────────────────────────────────────────────────────┐                        │
│    │ Receive MRI signals from the excited nuclei of the selected portion using a │ ─1514       │
│    │                             receive coil                                    │             │
│    └──────────────────────────────────────────────────────────────────┘                        │
│                                         ↓                                                      │
│    ┌──────────────────────────────────────────────────────────────────┐                        │
│    │ Generate an image of the selected portion using the received MRI signals │ ─1516          │
│    └──────────────────────────────────────────────────────────────────┘                        │
└─────────────────────────────────────────────────────────────────────────┘
```

Fig. 15

MRI SADDLE BASED FLEXIBLE ARRAY COIL

REFERENCE TO RELATED APPLICATION

This application claims the benefit of U.S. Provisional Application No. 63/093,874, filed on Oct. 20, 2020, the contents of which are incorporated by reference in their entirety.

BACKGROUND

Magnetic resonance imaging (MRI) involves the transmission and receipt of radio frequency (RF) energy. RF energy may be transmitted by an RF coil to create a $B_1$ field that rotates a net magnetization. Further, resulting magnetic resonance (MR) signals may be received by an RF coil to detect precessing transverse magnetization. Thus, RF coils may be transmit (Tx) coils, receive (Rx) coils, or transmit and receive (Tx/Rx) coils.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A and 7B illustrate axial views of some embodiments of a saddle based flexible array coil.

FIG. 8 illustrates a schematic view of some embodiments of a saddle based flexible array coil comprising six saddle coil elements distributed across three rows.

FIG. 15 illustrates a flow diagram of some embodiments corresponding to a method of conducting an MRI process using an array of saddle coil elements.

DETAILED DESCRIPTION

Figure 1:
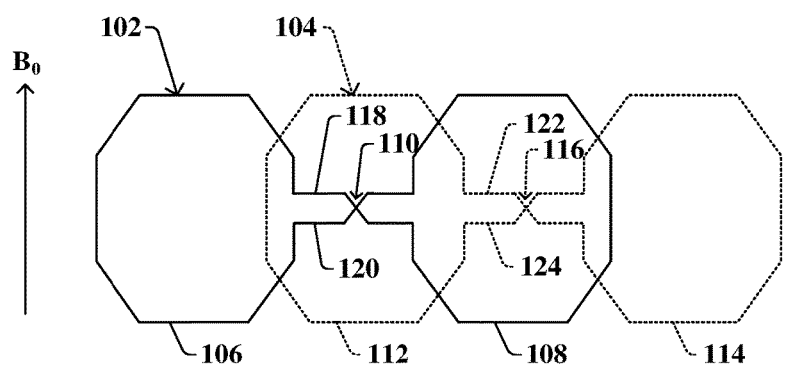
FIG. 1 illustrates a schematic view of some embodiments of a saddle based flexible array coil comprising a first saddle coil element partially overlapping with a second saddle coil element.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Since the introduction of the nuclear magnetic resonance (NMR) phased array coil as a receive (Rx) coil, it has become widely used in almost all anatomies as a magnetic resonance imaging (MRI) Rx coil. A phased array coil has higher signal-to-noise ratio (SNR) near the shallow imaging area similar to a small coil while also having a higher SNR near the deep imaging area similar to a large coil. A phased array coil comprises multiple circular, rectangular, or square-shaped coil elements arranged in an array of columns and row(s). The rows are separated from one another in a $B_0$ direction. Overlapping coil elements within a same row and low impedance preamplifiers may be used to minimize mutual inductance coupling between coil elements. Further, mutual inductance coupling between coil elements in neighboring rows is reduced by shifting the coil elements in the column direction such that two diagonal coil elements of two different rows overlap.

Phased array coils comprising loop-shaped coil elements are often used in flexible array coils because of their simplicity. A flexible array coil is a general coil that is flexible, uses less coils, costs less, and also fits better around several anatomies due to its flexibility. Because a flexible array coil can conform well to anatomies, the separation between the flexible array coil and the anatomy is reduced, which improves the SNR of the flexible array coil. However, for cylindrical based anatomies (e.g., knee, wrist, leg, arm, foot, shoulder, head, etc.), the aforementioned flexible array coil would be arranged in a cylindrical-like or half-cylindrical-like configuration, which may actually worsen the SNR of the flexible array coil. For these cylindrical-like or half-cylindrical-like configurations that wrap around the cylindrical based anatomies, mutual inductance coupling between the coil elements increases compared to flat-like configurations used for imaging of other anatomies, such as a torso.

In the flat-like configurations, mutual inductance between non-direct neighboring coil elements is low because the non-direct neighboring coil elements are separated from one another. In cylindrical-like and half-cylindrical-like configurations, non-direct neighboring coil elements have overlapping image areas, especially at the center of the image area, which significantly increases mutual inductance between the non-direct neighboring coil elements. Unless the angles between the neighboring coil elements are around 90 degrees, the mutual inductance between the coil elements in cylindrical-like and half-cylindrical-like configurations can be high at −3 decibels, for example.

More specifically, mutual inductance is particularly large between two coil elements that face each other on opposite sides of a center of the cylindrical-like configuration, between nearest neighboring coil elements within the same row, between the next nearest neighboring coil elements within the same row, and between coil elements in neighboring rows and without overlapping. The large mutual inductance negatively impacts the SNR of the resulting MRI image. Transformers or capacitors may be used for decoupling of non-direct neighboring coil elements, but as the number of coil elements increase in a cylindrical-like configuration, integrating transformers or capacitors becomes complex. Further, adding transformers or capacitors beside other circuit elements may reduce the flexibility of the phased array coil. Lastly, although the transformers or capacitors may reduce mutual inductance for cylindrical-like configurations, the mutual inductance may not improve or may become worse for flat configurations.

Various embodiments of the present disclosure relate to a saddle based flexible array coil comprising at least a first saddle coil element and a second saddle coil element arranged in a first row. The saddle based flexible array coil is versatile as it minimizes mutual inductance for flat, cylindrical, and half-cylindrical-like configurations. The first saddle coil element overlaps with the second saddle coil element. The first saddle coil element and the second saddle coil element each comprise at a first loop, a second loop, a first connection segment, and a second connection segment. The first and second connection segments, which cross one another, are arranged directly between and also connect the first loop and the second loop. Each saddle coil element comprises a continuous wire, conductive trace, coaxial cable, or the like configured in the aforementioned loop and connection segment "saddle" configuration. As will be discussed further, at least the length of the saddle coil elements, the orientation of the connection segments and the saddle coil element configuration itself contribute to a reduction in mutual inductance and improvement in SNR of MRI images produced using a saddle based flexible array coil.

FIG. 1 illustrates a schematic view 100 of some embodiments of a saddle based flexible array coil comprising two saddle coil elements.

The saddle based flexible array coil of FIG. 1 includes a first row comprising a first saddle coil element 102 and a second saddle coil element 104 that partially overlaps the first saddle coil element 102. The first saddle coil element 102 is illustrated with a solid line, whereas the second saddle coil element 104 is illustrated with a dotted line for ease of differentiating between the first and second saddle coil elements 102, 104; the difference in line design in FIG. 1 does not necessarily indicate a difference in structure between the first and second saddle coil elements 102, 104. The first saddle coil element 102 comprises a continuous conductive wire or trace (e.g., copper) arranged in loops or coils and may further comprise various circuits and circuit elements such as capacitors, amplifiers, diodes, and/or the like. The second saddle coil element 104 comprises a continuous conductive wire or trace (e.g., copper) arranged in loops or coils and may further comprise various circuits and circuit elements such as capacitors, amplifiers, diodes, and/or the like. In some embodiments, the loops (106, 108, 112, 114) may be circular, rectangular, square-shaped, or some other shape from the schematic view 100.

The saddle based flexible array coil is configured as a transmit (Tx) coil and/or a receive (Rx) coil for generating an MRI image of a scan object. The second saddle coil element 104 is offset from the first saddle coil element 102 in the column direction to partially overlap the first saddle coil element 102. In the planar configuration shown in FIG. 1, the column direction is perpendicular to a $B_0$ direction. In a cylindrical configuration, the column direction circumferentially surrounds the $B_0$ direction, wherein the cylindrical configuration is centered around the $B_0$ direction. (see, e.g., FIG. 6). The $B_0$ direction is the direction of a $B_0$ magnetic field that is applied to the saddle based flexible array coil during operation to align nuclei spinning in the scan object to the $B_0$ direction. During operation of scanning an object, a $B_1$ magnetic field is applied to the scan object using radio frequency (RF) energy to excite nuclei at a portion of the scan object and to produce the MRI image. The saddle based flexible array coil may be employed as a Tx coil to excite the nuclei with the RF energy and/or to receive MR signals from the excited nuclei.

The first saddle coil element 102 comprises a first loop 106 and a second loop 108 connected to one another by a first connection segment 118 and a second connection segment 120. In some embodiments, the first loop 106 and the second loop 108 comprise a same structure (e.g., shape, total length, circuit elements, etc.), whereas in some other embodiments, the first loop 106 and the second loop 108 comprise a different structure (e.g., shape, total length, circuit elements, etc.). The first and second connection segments 118, 120 of the first saddle coil element 102 cross at a first cross-region 110 to create the "saddle" configuration. The first and second connection segments 118, 120 are completely spaced apart from one another, even at the first cross-region 110. Thus, in FIG. 1, the first connection segment 118 may be behind or in front of the second connection segment 120 at the first cross-region 110, but the first connection segment 118 does not directly contact the second connection segment 120 at the first cross-region 110.

In some embodiments, the first and second connection segments 118, 120 are arranged very close to one another in the $B_0$ direction to reduce the magnetic flux of the first and second connection segments 118, 120. For example, in some embodiments, the first connection segment 118 is spaced apart from the second connection segment 120 by a distance in a range of between, for example, approximately 0.5 millimeters and approximately 2 millimeters. It will be appreciated that other ranges for the distance between the first connect segment 118 and the second connection segment 120 are within the scope of this disclosure. In some embodiments, the first connection segment 118 is arranged right above the second connection segment 120 on the left side of the first cross-region 110 as long as the parasitic capacitance between the first and second connection segments 118, 120 is not too large as to create tuning or quality factor issues.

Because of the first cross-region 110 of the first and second connection segments 118, 120, the current traveling through the first connection segment 118 is opposite in direction to the current traveling through the second connection segment 120. Therefore, when the saddle based flexible array coil is employed as a Tx coil for MRI imaging, the magnetic fields from the first and second connection segments 118, 120 cancel out or almost cancel out one another because the first and second connection segments 118, 120 are arranged close to one another. Because of the cancelling out of the magnetic fields produced by the first and second connection segments 118, 120, the first and second connection segments 118, 120 do not significantly contribute to the overall $B_1$ magnetic field produced by the saddle based flexible array coil. If the first and second connection segments 118, 120 were to significantly contribute to the overall $B_1$ magnetic field produced by the saddle based flexible array coil, the SNR of the saddle based flexible array coil may be degraded.

The connection segments 118, 120 add resistance to the overall resistance of the conductive wire or trace. However, noise depends at least on a ratio of the length of the connection segments 118, 120 to the length of the overall conductive wire or trace of the saddle coil element 102. Because the first and second loops 106, 108 are large loops compared to the first and second connection segments 118, 120, this ratio is low, thereby reducing noise and increasing SNR. Thus, the noise from the connection segments 118, 120 is minimal. As will be described in more detail in FIG. 2, this ratio that influences noise by the connection segments 118, 120 can be reduced by increasing the length of the first and second loops 106, 108 through multiple turns.

In some embodiments, the second saddle coil element 104 comprises a third loop 112 and a fourth loop 114 connected to one another by a third connection segment 122 and a fourth connection segment 124. In some embodiments, the third loop 112 and the fourth loop 114 comprise a same structure (e.g., shape, perimeter, circuit elements, etc.), whereas in some other embodiments, the third loop 112 and the fourth loop 114 comprise a different structure (e.g., shape, perimeter, circuit elements, etc.) from one another. The third and fourth connection segments 122, 124 of the second saddle coil element 104 cross at a second cross-region 116 to create the "saddle" configuration. In some embodiments, the third loop 112, the fourth loop 114, the third connection segment 122, and the fourth connection segment 124 operate the same as and have similar features as discussed above with respect to the first loop 106, the second loop 108, the first connection segment 118, and the second connection segment 120, respectively. In other words, in some embodiments, the second saddle coil element 104 has a same structure as the first saddle coil element 102, but is simply offset from the first saddle coil element 102 in the column direction. In some other embodiments, the first and second saddle coil elements 102, 104 may have different structures (e.g., shape, wire length, circuit elements, etc.) than one another. The first and second saddle coil elements 102, 104 at least partially overlap one another to improve the SNR, as will be explained in more detail with regard to FIGS. 4 and 5.

In some embodiments, the loops (106, 108, 112, 114) of the first and/or second saddle coil elements 102, 104 are one-turn loops, meaning the conductive wire or trace loops around once on the left side of the connection segments (118, 120 or 122, 124) to form a left loop (106 or 112) and loops around once on the right side of the connection segments (118, 120, 122, 124) to form a right loop (108 or 114). The connection segments (118, 120, 122, 124) are also in a one-turn configuration in FIG. 1. In some other embodiments, to further reduce any noise from the connection segments (118, 120, 122, 124), the loops (106, 108, 112, 114) of the first and/or second saddle coil elements 102, 104 are two-turn loops, as will be discussed in more detail with regard to FIG. 2.

Figure 2:
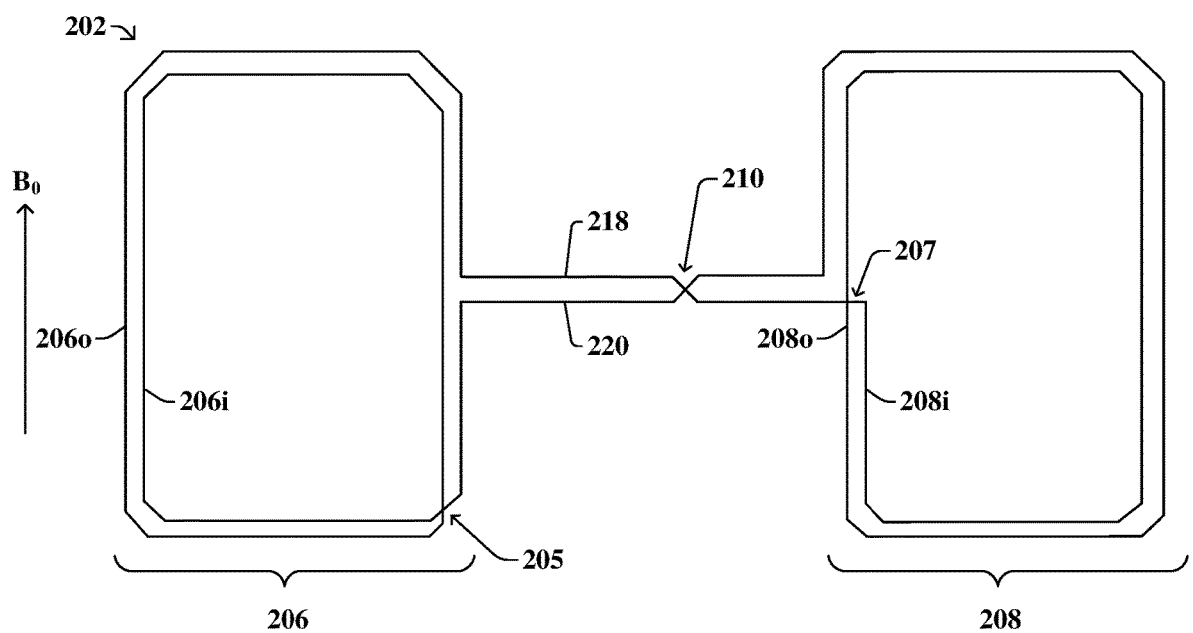
FIG. 2 illustrates a schematic view of some embodiments of a saddle coil element, wherein each loop of the saddle coil element has two turns.

FIG. 2 illustrates a schematic view 200 of some embodiments of a saddle coil element comprising two-turn loops.

The schematic view 200 includes a two-turn saddle coil element 202, which comprises a first two-turn loop structure 206 and a second two-turn loop structure 208 connected to one another by a first one-turn connection segment 218 and a second one-turn connection segment 220. The first and second two-turn loop structures 206, 208 are considered "two-turn" because the wire or trace of the two-turn saddle coil element 202 loops around twice in two circle-like or loop-like configurations for each of the first and second two-turn loop structures 206, 208. Thus, the first two-turn loop structure 206 comprises a first inner loop 206$i$ and a first outer loop 206$o$. The first inner loop 206$i$ and the first outer loop 206$o$ overlap with one another at a first inner/outer cross-region 205. However, the first inner loop 206$i$ and the first outer loop 205$o$ do not directly contact one another at the first inner/outer cross-region 205. The second two-turn loop structure 208 comprises a second inner loop 208$i$ and a second outer loop 208$o$. The second inner loop 208$i$ and the second outer loop 208$o$ overlap with one another at a second inner/outer cross-region 207. However, the second inner loop 208$i$ and the second outer loop 208$o$ do not directly contact one another at the second inner/outer cross-region 207. In some embodiments, the first and second inner/outer cross-regions 205, 207 are symmetric along an axis extending in the $B_0$ direction, whereas in some other embodiments, the first and second inner/outer cross-regions 205, 207 are asymmetric along an axis extending in the $B_0$ direction.

Even with the two-turn loop configuration, the two-turn saddle coil element 202 is defined as continuous wire or trace or coaxial cable. Further, in some embodiments, although the first and second two-turn loop structures 206, 208 are in a two-turn configuration, the first and second one-turn connection segments 218, 220 remain in a "one-turn" configuration, meaning that the first and second one-turn connection segments 218, 220 cross only once at a one-turn cross-region 210.

The noise of the two-turn saddle coil element 202 of FIG. 2, as well as other saddle coil elements (e.g., 102, 104 of FIG. 1), is at least proportional to a ratio of the length of the first and second connection segments 218, 220 to the total conductive wire length of the two-turn saddle coil element 202 of FIG. 2. Thus, a two-turn saddle coil element 202 has a longer total conductive wire length than a one-turn saddle coil element (e.g., 102, 104 of FIG. 1) that has otherwise similar dimensions (e.g., connection segment lengths, height of loops, width of loops, shape of loops, etc.). The two-turn saddle coil element 202 also increases the total conductive wire length without significantly increasing the schematic view 200 area of the two-turn saddle coil element 202. In some embodiments, the saddle coil element 202 may have even more than two turns to further improve SNR. However, as the number of turns of a saddle coil element increase, the flexibility of the saddle coil element decreases, and the complexity of forming the saddle coil element increases.

Because the two-turn saddle coil element 202 is longer, the noise is reduced based on the ratio of the length of the first and second connection segments 218, 220 to the total conductive wire length compared to a one-turn saddle coil element (e.g., 102, 104). Additionally, the first and second one-turn connection segments 218, 220 remain in a one-turn configuration such that the numerator of the ratio that is proportional to noise does not increase. When the ratio and thus, noise are reduced, the SNR of the overall two-turn saddle coil element 202 is improved. Therefore, in some embodiments, one or both of the first and second saddle coil elements 102, 104 of FIG. 1 may be replaced by a two-turn saddle coil element 202 of FIG. 2 to further improve the SNR and thus, reliability of the saddle based flexible array coil of FIG. 1.

Figure 3:
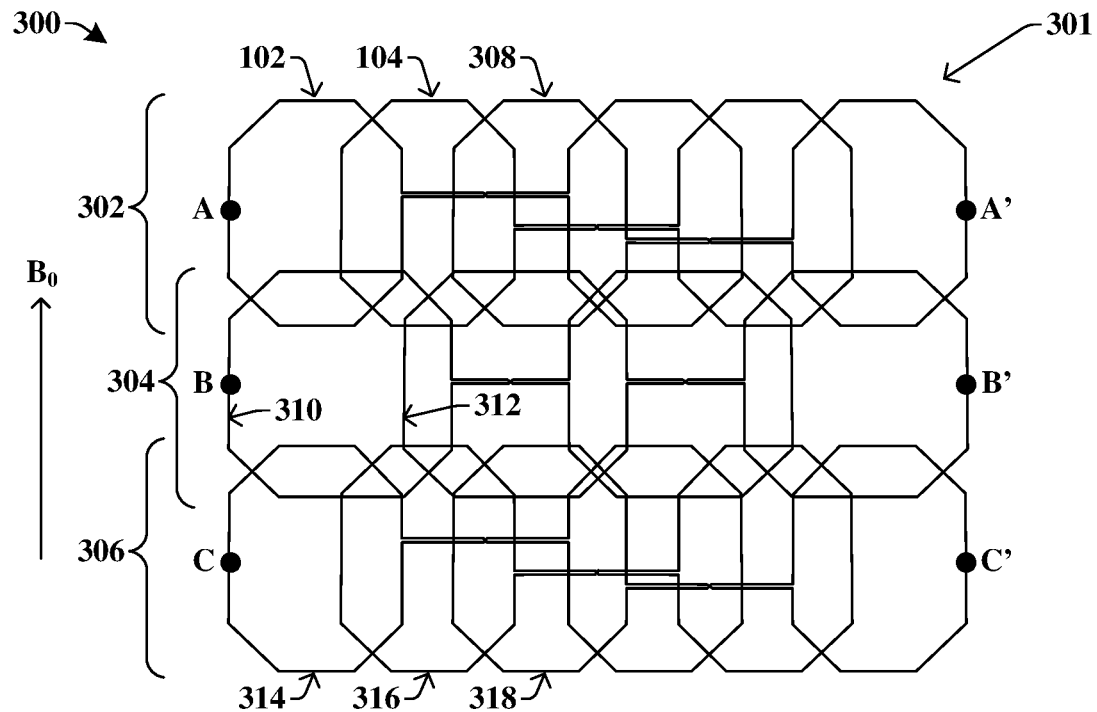
FIG. 3 illustrates a schematic view of some embodiments of a saddle based flexible array coil comprising eight saddle coil elements distributed across three rows.

FIG. 3 illustrates a schematic view 300 of some embodiments of a saddle based flexible array coil comprising eight saddle coil elements distributed amongst three rows.

The schematic view 300 of FIG. 3 includes an 8-element saddle based flexible array coil 301 that comprises a first row 302, a second row 304, and a third row 306 laterally offset from one another and overlapping in the $B_0$ direction. For simplicity, the breaking point capacitors, matching circuits, decoupling circuits, and other supporting electronics are not drawn in FIG. 3. Further, for simplicity, the loops and connection segments, which are described at least in FIGS. 1 and 2 are not labeled in FIG. 3. In some embodiments, the first row 302 comprises the first saddle coil element 102, the second saddle coil element 104, and a third saddle coil element 308, wherein the first, second, and third saddle coil elements 102, 104, 308 are spaced apart from one another but also partially overlap with one another in the column direction. In some embodiments, the first, second, and third saddle coil elements 102, 104, 308 are one-turn saddle coil elements, two-turn saddle coil elements, more than two-turn saddle coil elements, or a combination thereof.

In some embodiments, the second row 304 comprises a fourth saddle coil element 310 and a fifth saddle coil element 312 spaced apart from one another but also partially overlapping with one another in the column direction. Thus, in some embodiments, the number of saddle coil elements 310, 312 in the second row 304 is different than the number of saddle coil elements 102, 104, 308 in the first row 302. In other embodiments, the number of coil elements in the first row 302 versus the second row 304 is the same. Further, in some embodiments, the fourth and fifth saddle coil elements 310, 312 of the second row 304 are larger in the column and/or the $B_0$ direction than the first, second, and third saddle coil elements 102, 104, 308. In some embodiments, the loops 106, 108, 406, 408 of the 8-element saddle based flexible array coil 301 may each have a diameter in a range of between, for example, approximately 8 centimeters and approximately 16 centimeters. It will be appreciated that the similarity and/or differences in the structure (e.g. number of loop turns, size of loops, size of connection segments, circuit elements, etc.) of saddle coil elements within each row, and/or of saddle coil elements between each row may vary.

In some embodiments, the third row 306 comprises a sixth saddle coil element 314, a seventh saddle coil element 316, and an eighth saddle coil element 318 spaced apart from one another but also partially overlapping with one another in the column direction. Thus, in some embodiments, both the first row 302 and the third row 306 each comprise three saddle coil elements, whereas the second row 304 comprises two saddle coil elements. Such a configuration may be defined as a "3+2+3" configuration. In some embodiments, the 8-element saddle based flexible array coil 301 is used in a flat-configuration as shown in FIG. 3. In some other embodiments, the 8-element saddle based flexible array coil 301 is flexible and thus, can be circumferentially wrapped to form a cylindrical-like or half-cylindrical-like configuration. In a full cylindrical-like configuration, at least point A borders point A' and the left loop of the first saddle coil element 102 partially overlaps with the right loop of the third saddle coil element 308 in the first row 302; point B borders point B' and the left loop of the fourth saddle coil element 310 partially overlaps with the right loop of the fifth saddle coil element 312 in the second row 304; and point C borders point C' and the left loop of the sixth saddle coil element 314 partially overlaps with the right loop of the eighth saddle coil element 318 in the third row 306. Thus, the 8-element saddle based flexible array coil 301 can be used in flat, cylindrical-like, or half-cylindrical-like configurations to accommodate various applications.

Further, in some embodiments, the second row 304 partially overlaps with the first row 302 and the third row 306 in the $B_0$ direction. The overlapping between loops of the saddle coil elements (102, 104, 308, 310, 312, 314, 316, 318) in the column and $B_0$ directions provides a decoupling benefit between direct neighboring saddle coil elements such as the first saddle coil element 102 and the second saddle coil element 104; the second saddle coil element 104 and the third saddle coil element 308; the first saddle coil element 102 and the fourth saddle coil element 310; and so on. Further, because each saddle coil element (102, 104, 308, 310, 312, 314, 316, 318) is in a saddle configuration, the loops of each saddle coil element are spaced far apart from one another by the connection segments. The spacing between loops within a same saddle coil element provides better isolation compared to two spaced coil elements each comprising a single loop. Therefore, the 8-element saddle based flexible array coil 301 of FIG. 3 has an overall better SNR than a phased array coil that comprises single loops and not saddle-based coil elements.

Additionally, the 8-element saddle based flexible array coil 301 has improved isolation in cylindrical-like and half-cylindrical-like configurations because loops from a same saddle coil element face one another across a center of the cylindrical-like configuration, as will be described in more detail in FIG. 6. Thus, the saddle coil elements (102, 104, 308, 310, 312, 314, 316, 318) reduce noise typically present between opposite loops of a same row in a cylindrical-like or half-cylindrical-like phased array coil that comprises single loops and not saddle-based coil elements. Lastly, each saddle coil element (102, 104, 308, 310, 312, 314, 316, 318) itself has a lower noise because of the relationship between noise and the length of connection segments and overall saddle coil element length as described in FIG. 2.

Figure 4:
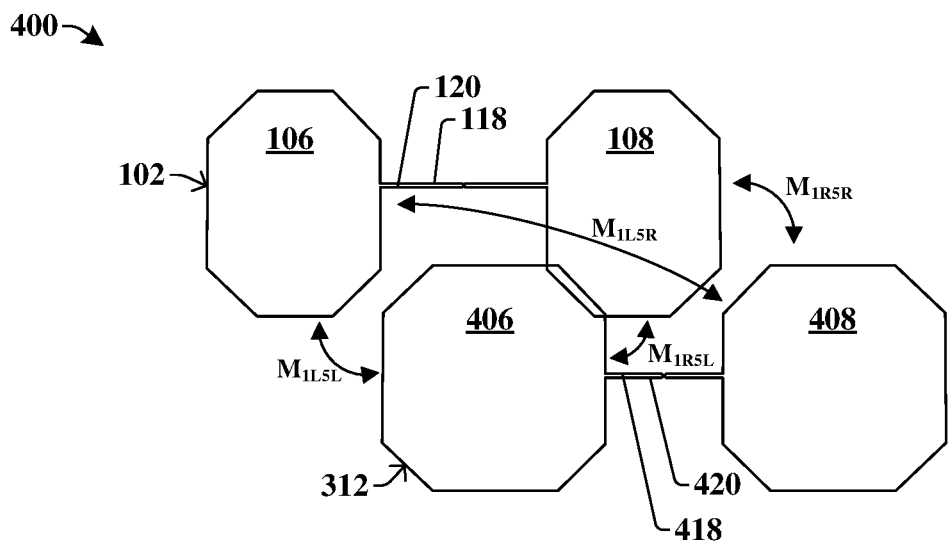
FIG. 4 illustrates a schematic view of some embodiments of first and fifth saddle coil elements of FIG. 3 to illustrate the mutual inductance relationships between the first and fifth saddle coil elements.

FIG. 4 illustrates a schematic view 400 of some embodiments of only the first saddle coil element 102 of FIG. 3 overlapping with the fifth saddle coil element 312 of FIG. 3 to describe the mutual inductance relationship between the first and fifth saddle coil elements 102, 312.

The first saddle coil element 102 comprises a first loop 106 arranged on the left of the first and second connection segments 118, 120 and a second loop 108 arranged on the right of the first and second connection segments 118, 120. The fifth saddle coil element 312 comprises a fifth loop 406 arranged on the left of fifth and sixth connection segments 418, 420 and a sixth loop 408 arranged on the right of the fifth and sixth connection segments 418, 420. The sub-mutual inductance between the first loop 106 of the first saddle coil element 102 and the fifth loop 406 of the fifth saddle coil element 312 is represented as $M_{1L5L}$ in FIG. 4. The sub-mutual inductance between the first loop 106 of the first saddle coil element 102 and the sixth loop 408 of the fifth saddle coil element 312 is represented as $M_{1L5R}$ in FIG. 4. The sub-mutual inductance between the second loop 108 of the first saddle coil element 102 and the fifth loop 406 of the fifth saddle coil element 312 is represented as $M_{1R5L}$ in FIG. 4. The sub-mutual inductance between the second loop 108 of the first saddle coil element 102 and the sixth loop 408 of the fifth saddle coil element 312 is represented as $M_{1R5R}$ in FIG. 4. The mutual inductance between the connection segments (118, 120, 418, 420) in FIG. 4 are not illustrated and will be ignored as they are substantially small and only provide a trivial magnetic flux. Because the first loop 106 does not overlap with the fifth loop 406 and/or because the first loop 106 does not have a perpendicular $B_1$ field with the fifth loop 406, the sub-mutual inductance $M_{1L5L}$ of the first and fifth loops 106, 406 is not small. However, because the first loop 106 and the fifth loop 406 have partnering loops (the second loop 108 and the sixth loop 408, respectively), the mutual inductance $M_{12}$ between the first saddle coil element 102 and the fifth saddle coil element may be written as follows if the first and fifth saddle coil elements 102, 312 are the same size: $M_{12}=0.25(M_{1L5L}+M_{1L5R})+0.25(M_{1R5L}+M_{1R5R})$.

In some embodiments of a cylindrical-like configuration, the first loop 106 is on an opposite side of the cylinder to the second loop 108, and the fifth loop 406 is on an opposite side of the cylinder to the sixth loop 408. Therefore, because the first loop 106 and the fifth loop 406 are respectively far away from the second loop 108 and the sixth loop 408, $M_{1L5L}$ and $M_{1L5R}$ can be significantly different than one another and even have different signs. For example, it will be assumed that $M_{1L5L}=M_{1R5R}=0.5$ arbitrary units (au), and $M_{1L5R}=M_{1R5L}=-0.2$ au. With such assumptions, the total mutual inductance Mu between the first and fifth saddle coil elements 102, 312 is equal to 0.15 au, which is less mutual inductance, and thus, less noise than 0.5 au of the mutual inductance $M_{1L5L}$ between the first loop 106 and fifth loop 406 and the mutual inductance $M_{1R5R}$ between the second loop 108 and the sixth loop 408. Another example may be when $M_{1L5L}=M_{1R5R}=0.5$ au, and $M_{1L5R}=M_{1R5L}=0.2$ au. In such embodiments, the total mutual inductance Mu between the first and fifth saddle coil elements 102, 312 is equal to 0.35 au, which is still less mutual inductance, and thus, less noise than 0.5 au of the mutual inductance $M_{1L5L}$ between the first loop 106 and fifth loop 406 and the mutual inductance $M_{1R5R}$ between the second loop 108 and the sixth loop 408.

Therefore, the spaced apart first and second loops 106, 108 of the first saddle coil element 102 and the spaced apart fifth and sixth loops 406, 408 of the fifth saddle coil element 312 reduces the total mutual inductance Mu between the first and fifth saddle coil elements 102, 312 because spacing apart the loops (106, 108 and 406, 408) with the connection segments (118, 120 and 418, 420) creates a large difference in mutual inductance between the left loop (106 and 406) and the right loop (108 and 408) within a same saddle coil element (102 and 312).

Figure 5:
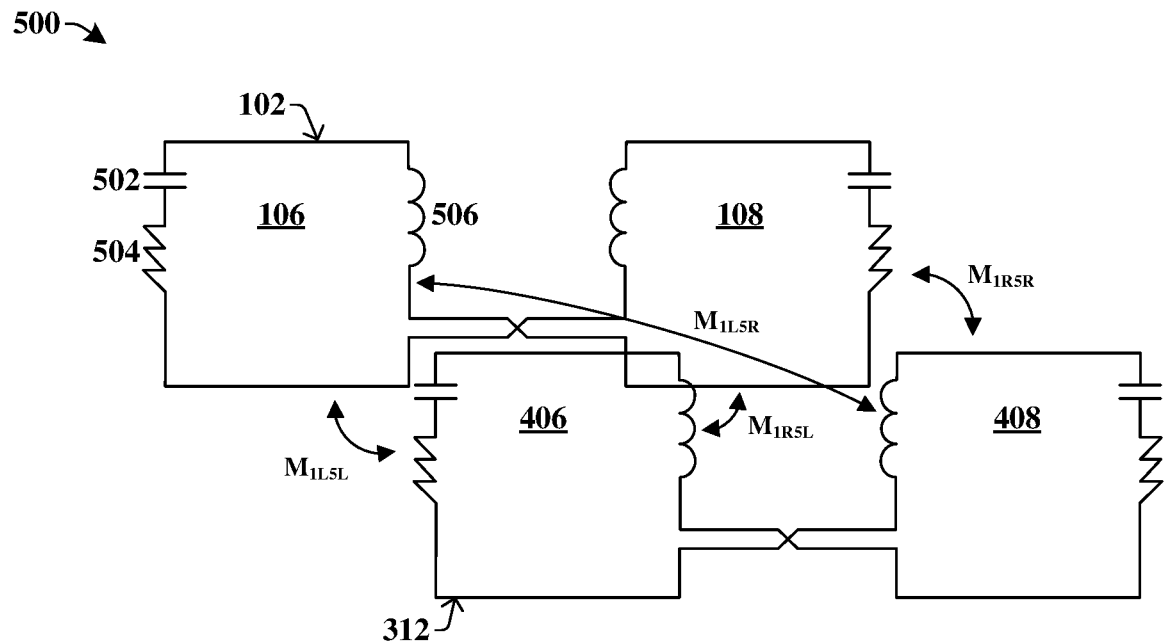
FIG. 5 illustrates an equivalent circuit of some embodiments of the first and fifth saddle coil elements of FIG. 4, wherein the first and fifth saddle coil elements comprise exemplary circuit elements.

FIG. 5 illustrates a schematic view 500 of the first and fifth saddle coil elements 102, 312 comprising exemplary circuit elements.

In some embodiments, each of the first loop 106, the second loop 108, the fifth loop 406, and the sixth loop 408 comprise a breaking point capacitor 502, coil loss 504, and a coil trace inductor 506. In other embodiments, the loops (106, 108, 406, 408) may comprise more or less circuit elements or other circuit elements than the breaking point capacitor 502, coil loss 504, and the coil trace inductor 506. The coil loss 504 includes copper loss, phantom loss, and RF radiation loss. The mutual inductances between the loops (106, 108, 406, 408) also depends on the circuit elements (e.g., 502, 504, 506).

In some embodiments, the noise of a first coil (e.g., 102) in the presence of a second coil (e.g., 312) is equal to about $\sqrt{(R_1+(\omega M)^2/R_2)}$, wherein $R_1$ is equal to the resistance of the first coil (e.g., 504 of 102), $R_2$ is equal to the resistance of the second coil (e.g., 504 of 312), w is equal to the angular frequency, and M is equal to the mutual inductance between the first and second coil. To further reduce noise, a low impedance preamplifier may be used, which replaces the resistance of the second coil $R_2$ in the above equation with $R_2+R_{preamp-decoup}$. Thus, the resistance from the low impedance preamplifier $R_{preamp-decoup}$ increases the denominator of the noise of the first coil equation, thereby reducing noise of the first coil.

Figure 6:
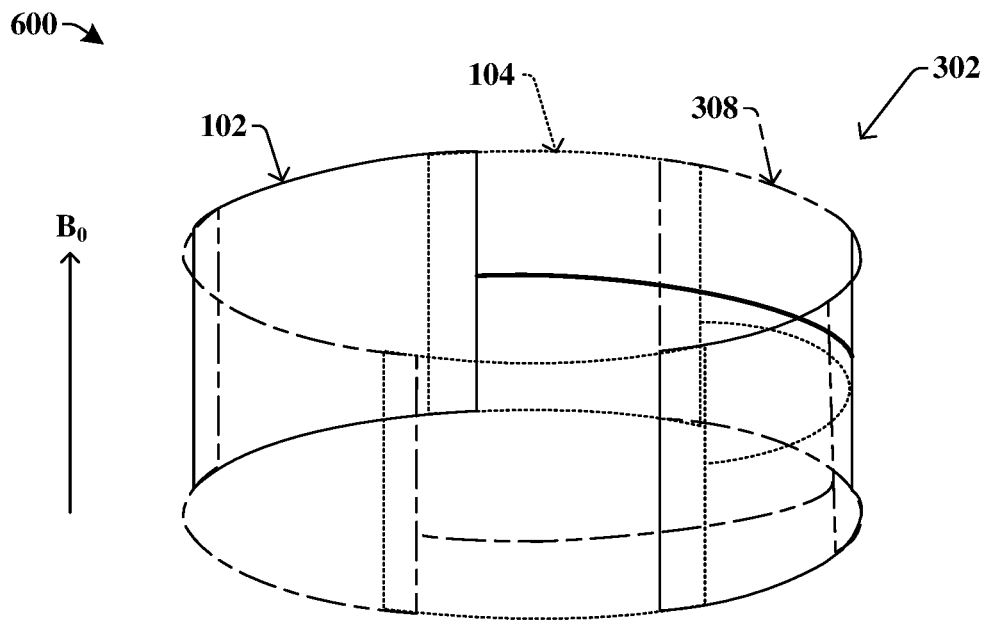
FIG. 6 illustrates a perspective view of some embodiments of a saddle based flexible array coil comprising three saddle coil elements distributed across one row and in a full cylindrical arrangement.

FIG. 6 illustrates a perspective view 600 of some embodiments of a saddle based flexible array coil corresponding to the first row 302 of the 8-element saddle based flexible array coil 301 of FIG. 3 in a cylindrical configuration.

Only the first row 302 of the 8-element saddle based flexible array coil 301 of FIG. 3 is included in FIG. 6 for simplicity. Further, the connection segments are illustrated as single lines, the connection segments are not labeled, and the loops of each saddle coil element (102, 104, 308) are not labeled for simplicity. Further yet, the first saddle coil element 102 is illustrated as a solid line; the second saddle coil element 104 is illustrated as a dotted line; and the third saddle coil element 308 is illustrated as a dashed line such that the first, second, and third saddle coil elements 102, 104, 308 can be distinguished from one another. It will be appreciated that the difference in line style in FIG. 6 does not necessarily indicate that the first, second, and third saddle coil elements 102, 104, 308 have different structures from one another.

As illustrated in FIG. 6, in some embodiments, due to the flexibility of the saddle coil elements (102, 104, 308), the first row 302 may be circumferentially arranged or wrapped around an axis to form a cylindrical-like configuration. Therefore, more reliable MRI imaging can be conducted on certain anatomies (e.g., knee, wrist, leg, arm, foot, shoulder, head, etc.) that can be completely surrounded by the first row because of the cylindrical-like configuration. In some embodiments, the two loops of the first saddle coil element 102 are arranged on opposite sides of the axis of the cylindrical configuration; the two loops of the second saddle coil element 102 are arranged on opposite sides of the axis of the cylindrical configuration; and the two loops of the first saddle coil element 308 are arranged on opposite sides of the axis of the cylindrical configuration. In other words, the loops of each saddle coil element (102, 104, 308) are arranged as far apart as possible to one another which reduces mutual inductance, and thus noise between the saddle coil elements (102, 104, 308).

Additionally, it is loops of the same saddle coil element (102, 104, 308) that face one another in a cylindrical-like configuration, which reduces mutual inductance compared to if loops of different coil elements faced one another. Further, because the loops of the same saddle coil element (102, 104, 308) face one another across an axis of the cylindrical-like configuration, the loops from a same saddle coil element (102, 104, 308) are arranged as far apart from one another as possible to reduce mutual inductance. In some other embodiments, the loops of a same saddle coil element (102, 104, 308) may not be arranged completely across from one another, but mutual inductance may still be minimized by spacing the loops of a same saddle coil element (102, 104, 308) far apart from one another.

Further, more overlap between loops can occur per saddle coil element (102, 104, 308) in the cylindrical-like configurations because each saddle coil element (102, 104, 308) comprises more than one loop, which overall helps reduce noise through decoupling. In the cylindrical-like configuration, the left loop of the first saddle coil element 102 overlaps both the left loop of the second saddle coil element 104 and the right loop of the third saddle coil element 308, whereas in the planar configuration (e.g., FIG. 3), the left loop of the first saddle coil element 102 only overlaps with the left loop of the second saddle coil element 104 within the first row 302. Lastly, these methods to reduce the mutual inductance and noise are especially important in cylindrical-like and half-cylindrical-like configurations because the SNR sensitivity of MRI imaging is increased at a center of cylindrical-like configuration or half-cylindrical-like configuration, which is where the anatomy to be imaged is arranged.

FIG. 7A illustrates an axial view 700A of some embodiments of a cylindrical-like configuration of a saddle based flexible array coil.

In some embodiments, the 8-element saddle based flexible array coil 301 of FIG. 3 is circumferentially arranged around a center axis 704, which corresponds to the $B_0$ direction. In some such embodiments, the 8-element saddle based flexible array coil 301 wraps around the outer surfaces of some anatomical feature 702 such as a knee, a wrist, a leg, an arm, a foot, a shoulder, a head, or the like such that the 8-element saddle based flexible array coil 301 can be as close to the anatomical feature 702 for the most reliable MRI imaging of the anatomical feature 702. The 8-element saddle based flexible array coil 301 of FIG. 7A can alternatively be any other saddle based flexible array coil that comprises at least one row comprising at least two saddle based flexible coil elements in an overlapping arrangement to reduce noise and improve SNR. Further, each saddle coil element of the 8-element saddle based flexible array coil 301 or alternative saddle based flexible array coil may be a one-turn saddle coil element (e.g., 102 of FIG. 1), a two-turn saddle coil element (e.g., 202 of FIG. 2), or more than two-turn saddle coil element to reduce noise and improve SNR.

FIG. 7B illustrates an axial view 700B of some embodiments of a half-cylindrical-like configuration of a saddle based phased array coil.

In the half-cylindrical-like configuration of the 8-element saddle based flexible array coil 301 of FIG. 7B, the 8-element saddle based flexible array coil 301 only wraps around half of the anatomical feature 702. Still, in some of such embodiments, the 8-element saddle based flexible array coil 301 is equally spaced apart from the center axis 704 in the radial direction. As stated above with respect to FIG. 7A, the 8-element saddle based flexible array coil 301 of FIG. 7B can alternatively be any other saddle based flexible array coil that comprises at least one row comprising at least two saddle based flexible coil elements in an overlapping arrangement to reduce noise and improve SNR.

Therefore, it will be appreciated that the saddle based flexible array coils presented herein (e.g., FIG. 1, 3, 6, etc.) may be in a flat configuration such as in FIGS. 1 and 3 or may be in cylindrical or cylindrical-like configurations as shown in FIGS. 7A and 7B.

FIG. 8 illustrates a schematic view 800 of some embodiments of a 6-element saddle based flexible array coil comprising six saddle coil elements distributed amongst three rows.

The schematic view 800 of FIG. 8 includes a 6-element saddle based flexible array coil 801 to provide another example of a multi-element saddle based flexible array coil 801. The 6-element saddle based flexible array coil 801 comprises two saddle coil elements in a first row 302, a second row 304, and a third row 306. Each saddle coil element within a same row is decoupled from one another because they overlap with one another in the column direction. The saddle coil elements that overlap one another are considered "neighboring coil elements." For example, the first row 302 comprises the first saddle coil element 102 and the second saddle coil element 104 which are neighboring coil elements. The first saddle coil element 102 comprises a first loop 106 and a second loop 108, wherein connection segments (see, 118, 120 of FIG. 1) connect the first and second loops 106, 108. The second saddle coil element 104 comprises a third loop 112 and a fourth loop 114, wherein connection segments (see, 122, 124 of FIG. 1) connect the third and fourth loops 112, 114. In some embodiments, the first cross-region 110 of the first saddle coil element 102 is surrounded by the third loop 112 of the second saddle coil element 104 (i.e., the neighboring coil element of the first saddle coil element 102). Similarly, in some embodiments, the second cross-region 116 of the second saddle coil element 104 is surrounded by the second loop 108 of the first saddle coil element 102 (i.e., the neighboring coil element of the second saddle coil element 104).

Saddle coil elements between each row are also decoupled for overlapping from one another in the $B_0$ direction. For non-neighboring rows, such as the first row 302 and the third row 306 in FIG. 8, coupling between the non-neighboring rows is intrinsically low, especially because of the saddle configurations in the saddle coil elements. Therefore, this 6-element saddle based flexible array coil 801, like the 8-element saddle based flexible array coil 301 of FIG. 3, has a low mutual inductance (e.g., low coupling), which improves the SNR of MRI imaging. It will be appreciated that yet other number of rows and number of saddle coil elements per row may be used to form a multi-element saddle based flexible array coil with an improved SNR such as, for example, a 3+3+3 array, a 4+3+4 array, a 4+4+4 array, a 3+4+3+4 array, and so on. Additionally, the multi-element saddle based flexible array coils (e.g., 301 of FIG. 3, 801 of FIG. 8, etc.) may comprise one-turn saddle coil elements (e.g., 102 of FIG. 1), two-turn saddle coil elements (e.g., 202 of FIG. 1), or more than two-turn saddle coil elements.

Figure 9:
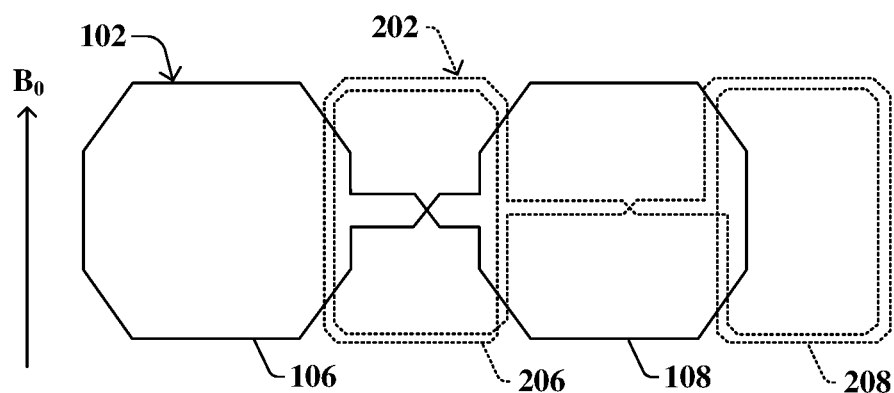
FIG. 9 illustrates a schematic view of some embodiments of a one-turn saddle coil element partially overlapping with a two-turn saddled coil element.

FIG. 9 illustrates a schematic view of yet some other embodiments of a saddle based flexible array coil comprising both one-turn and two-turn saddle coil elements.

In some embodiments, a two-turn saddle coil element 202 of FIG. 2 may overlap the first saddle coil element 102 of FIG. 1 that is a one-turn saddle coil element 102 in the column direction. This configuration may be used when manufacturing a two-turn saddle coil element (e.g., 202) is particularly complex but some SNR improvement from the two-turn saddle coil element (e.g., 202) is desired; time can be saved by producing one instead of two two-turn saddle coil elements (e.g., 202).

Figure 10A:
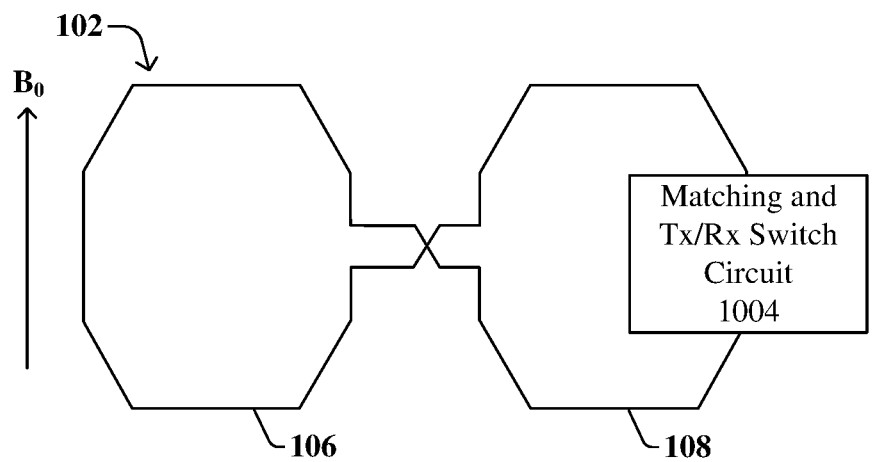
FIGS. 10A, 10B, and 10C illustrate schematic views of some embodiments of a single layer technology (SLT) saddle coil element comprising SLT circuitry.

FIG. 10A illustrates a schematic view of some embodiments of a single layer technology (SLT) saddle coil element comprising SLT circuitry such that the first saddle coil element 102 can operate in transmit (Tx) mode or in receive (Rx) mode.

In some embodiments, the first saddle coil element 102 comprises a matching and Tx/Rx switch circuit 1004. During MRI imaging, the first saddle coil element 102 may need to be tuned and matched. Tuning involves establishing or manipulating the capacitance of the first saddle coil element 102 so that a desired resistance or tuning frequency is produced. Matching involves establishing or manipulating the capacitance in a coil so that a desired reactance is achieved. The matching and Tx/Rx switch circuit 1004 allows the same first saddle coil element 102 to operate in either Tx mode or Rx mode.

When operating in Tx mode, the matching and Tx/Rx switch circuit 1004 may, for example, electrically isolate the first and second loops 106, 108 from other circuitry such as, for example, a preamplifier (not shown) when the first and second loops 106, 108 resonate with a primary coil (not shown) at a working frequency of the primary coil. In some embodiments, the matching and Tx/Rx switch circuit 1004 works to isolate the first and second loops 106, 108 from preamplifier by providing a threshold level of impedance between the first and second loops 106, 108 and the preamplifier.

When operating in Rx mode, the matching and Tx/Rx switch circuit 1004 may, for example, electrically connect the first and second loops 106, 108 to the preamplifier by providing an impedance lower than the threshold level of impedance between the first and second loops 106, 108 and the preamplifier. In some embodiments, the matching and Tx/Rx switch circuit may be a capacitive (see, e.g., FIG. 10B) or an inductance matching (see, e.g., FIG. 10C) Tx/Rx switch circuit.

Figure 10B:
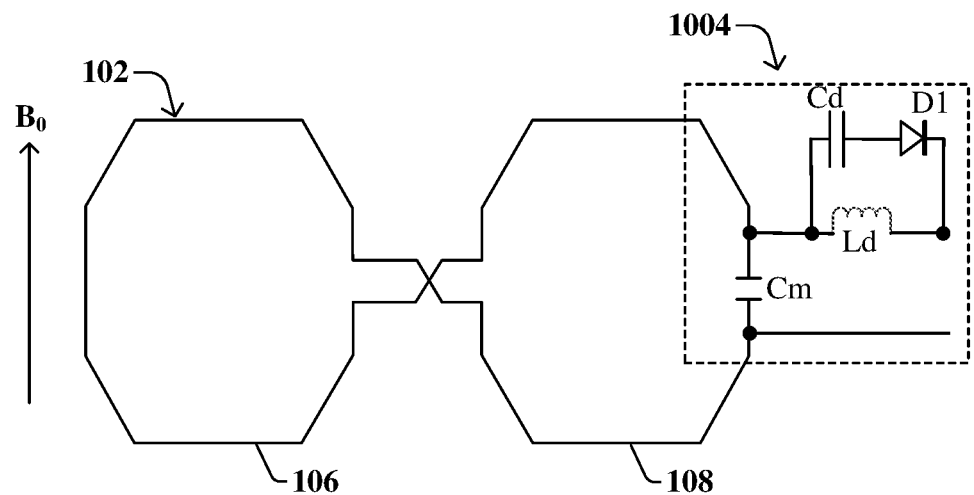

FIG. 10B illustrates exemplary components of the Tx/Rx switch circuit 1004 of FIG. 10A in a capacitive matching SLT saddle coil element without showing a preamplifier for simplicity. Therefore, the Tx/Rx switch circuit 1004 is not a completely connected circuit because a preamplifier and/or other circuit element may be included between the various circuit elements illustrated in the Tx/Rx switch circuit 1004 of FIG. 10B.

As shown in FIG. 10B, in some embodiments, the matching and Tx/Rx switch circuit 1004 of FIG. 10A comprises a matching capacitor Cm, a first diode D1, a capacitor Cd, and a first inductor Ld. In some embodiments, the first diode D1 is a PIN diode. In some embodiments, the first diode D1, capacitor Cd, and first inductor Ld create a resonant tank circuit in Tx mode when first diode D1 is forward biased. The resonant tank circuit Tx can effectively isolate the first and second loops 106, 108 from the preamplifier in Tx mode.

In this embodiment, matching capacitor Cm has a first terminal and a second terminal. Matching capacitor Cm is connected, at a first terminal, to a first terminal of first inductor Ld. First inductor Ld is connected at a first terminal, to a capacitor Cd, at a first terminal. Capacitor Cd is connected, at a second terminal, to first diode D1, at a first terminal. First diode D1 is connected, at a second terminal to first inductor Ld, at a second terminal. First inductor Ld is connected, at a second terminal, to a first input terminal of preamplifier (not shown). In Rx mode, first diode D1 is backward biased (e.g., first diode D1 has a high impedance in Rx mode), so that effectively only the first inductor Ld is presented between the matching capacitor Cm and the preamplifier. It will be appreciated that the matching Tx/Rx switch circuit 1004 may comprise more or less components than what is illustrated in FIG. 10B.

Figure 10C:
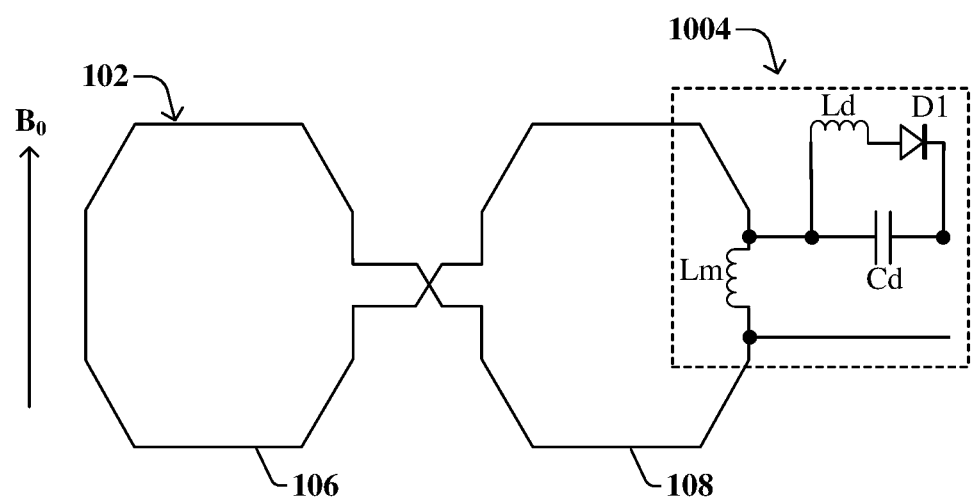

FIG. 10C illustrates exemplary components of the Tx/Rx switch circuit 1004 of FIG. 10A in an inductive matching SLT saddle coil element without showing a preamplifier for simplicity. Therefore, the Tx/Rx switch circuit 1004 is not a completely connected circuit because a preamplifier and/or other circuit element may be included between the various circuit elements illustrated in the Tx/Rx switch circuit 1004 of FIG. 10C.

As shown in FIG. 10C, in some embodiments, the matching and Tx/Rx switch circuit 1004 of FIG. 10A comprises a matching inductor Lm, a first diode D1, a capacitor Cd, and a first inductor Ld. In some embodiments, the first diode D1 is a PIN diode. In some embodiments, the first diode D1, capacitor Cd, and first inductor Ld create a resonant tank circuit in Tx mode when first diode D1 is forward biased. The resonant tank circuit Tx can effectively isolate the first and second loops 106, 108 from the preamplifier in Tx mode.

Thus, in this embodiment, the matching and Tx/Rx switch circuit 1004 operates as an inductive matching circuit. Matching inductor Lm is connected, at a first terminal, to a first terminal of the capacitor Cd. The capacitor Cd is connected at a first terminal, to the first inductor Ld, at a first terminal. The first inductor Ld is connected, at a second terminal, to first diode D1, at a first terminal. First diode D1 is connected, at a second terminal to the capacitor Cd, at a second terminal. The capacitor Cd is connected, at a second terminal, to a first input terminal of preamplifier (not shown). In Rx mode, first diode D1 is backward biased (e.g., first diode D1 has a high impedance in Rx mode), so that effectively capacitor Cd is presented between the matching inductor Lm and the preamplifier. It will be appreciated that the matching Tx/Rx switch circuit 1004 may comprise more or less components than what is illustrated in FIG. 10C.

Further, it will be appreciated that any of the saddle based coil elements in this disclosure may include the matching and Tx/Rx switch circuit 1004 of FIGS. 10A-C such that the saddle based flexible array coils described in this disclosure can function as SLT saddle based coil arrays.

Figure 11:
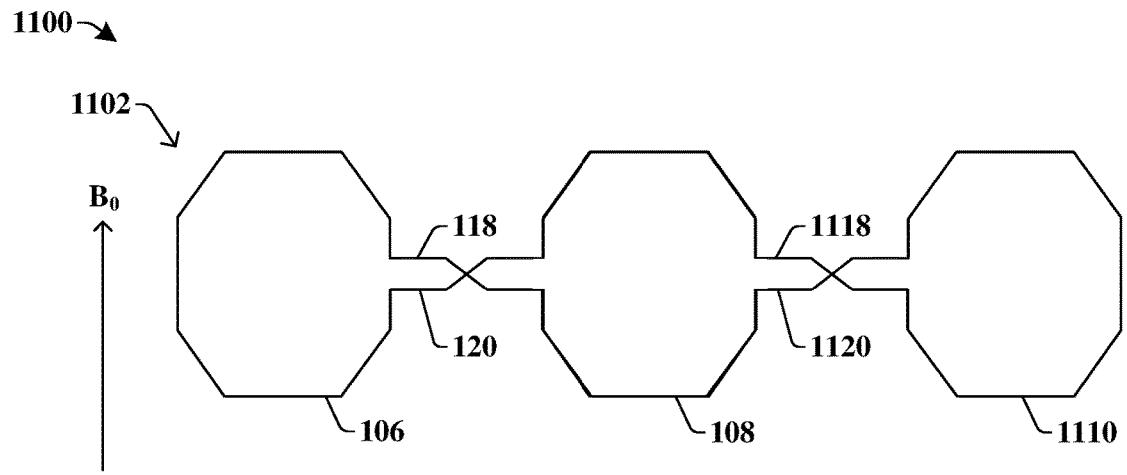
FIG. 11 illustrates a schematic view of some other embodiments of a saddle coil element that comprises three loops.

FIG. 11 illustrates a schematic view 1100 of some other embodiments of a saddle coil element that comprises three loops.

In some other embodiments, a third loop 1110 may be coupled to the second loop 108 through a first additional connection segment 1118 and a second additional connection segment 1120 to form a three-loop saddle coil element 1102 comprising the first, second, and third loops 106, 108, 1010.

Figure 12:
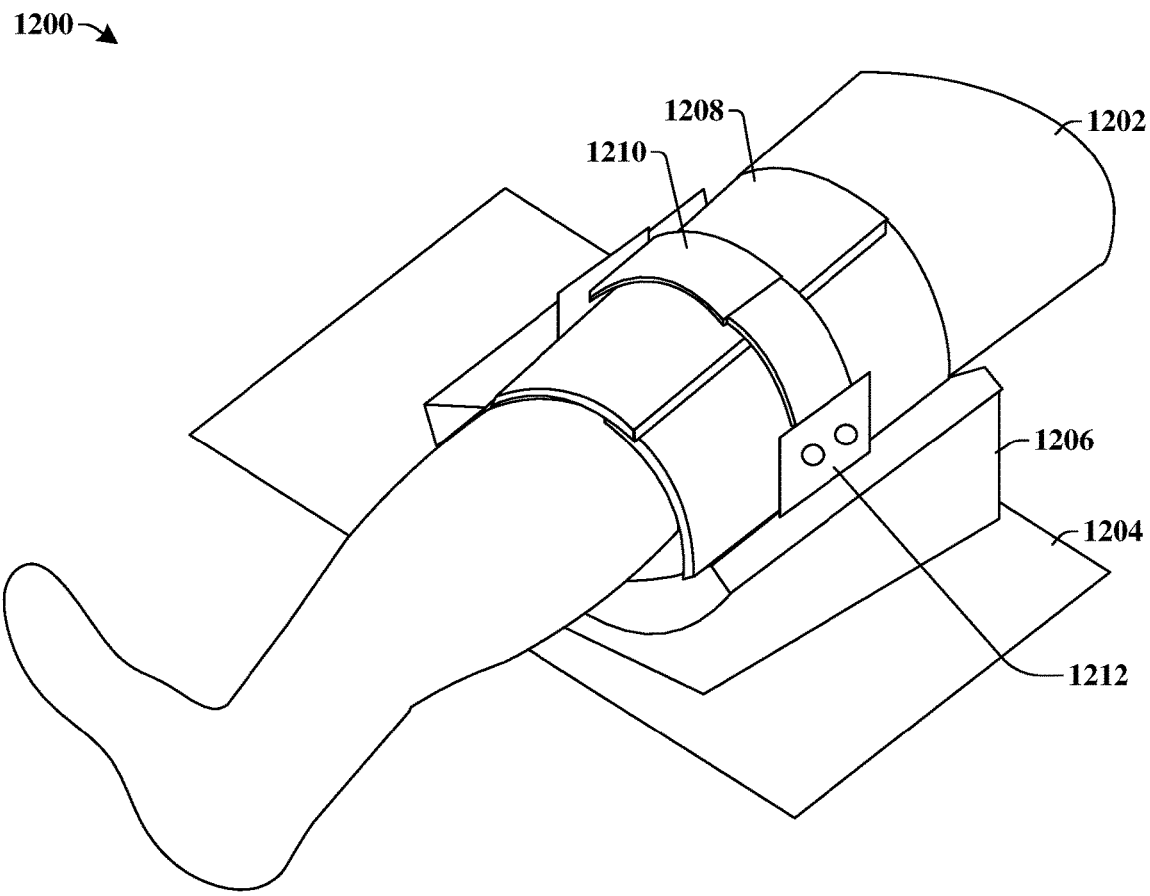
FIG. 12 illustrates a perspective view of some embodiments of a knee coil assembly in which a saddle based flexible array coil is attached to a rigid base and flexible straps for securely holding a knee.

FIG. 12 illustrates a perspective view 1200 of some embodiments of a knee coil assembly in which a saddle based flexible array coil is attached to a rigid base and straps for securely holding a knee.

In some embodiments, a saddle based flexible array coil 1208 (e.g., FIGS. 1, 2, 3, 6, 8) is attached to a rigid or half-rigid base 1206 fixed to a patient table 1204. The rigid or half-rigid base 1206 may be fixed to the patient table 1204 using the patient's own weight or some other additional mechanism (e.g., additional straps, additional base inserts to attach to patient table slots, latching the base to the patient table, etc.). In some embodiments, the saddle based flexible array coil 1208 is configured to wrap tightly around an anatomical feature such as, for example, a knee 1202 in FIG. 12. In some such embodiments, flexible straps 1210 may be attached to the rigid or half-rigid base 1206 through a connection structure 1212. Once the knee 1202 is inserted into the space between the rigid or half-rigid base 1206 and the saddle based flexible array coil 1208, the flexible straps 1210 are tightened to hold the knee 1202 tight such that the knee 1202 does not move during scanning. Movement of the knee 1202 during scanning would compromise the MRI image. In some embodiments, the saddle based flexible array coil 1208 completely wraps around to scan the knee 1202 using a cylindrical-like configuration. To increase the holding power of the knee 1202, in some other embodiments, some additional rigid wedge-style mechanical piece (not shown) may be put between the strap and the knee 1202 for additional strength. In other embodiments, instead of a knee 1202, the anatomical feature may be, for example, a leg, an arm, a wrist, a head, an ankle, or the like.

Figure 13:
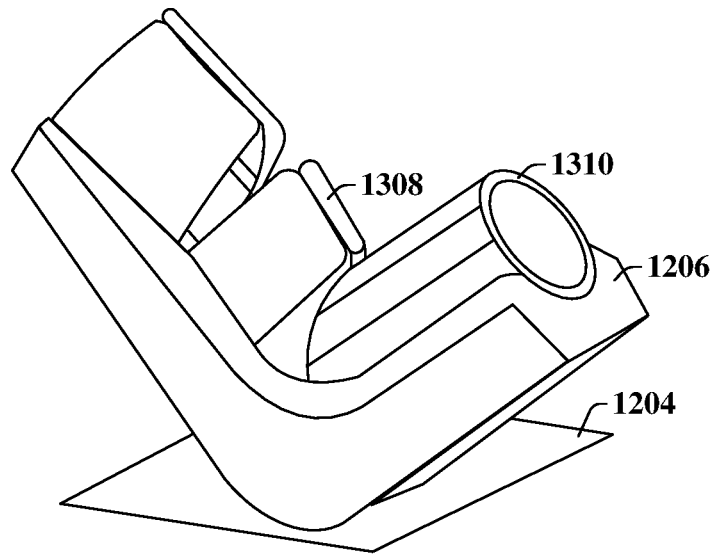
FIG. 13 illustrates a perspective view of some embodiments of a foot coil assembly in which a saddle based flexible array coil is attached to a rigid base for securely holding a foot.

FIG. 13 illustrates a perspective view 1300 of some embodiments of a foot coil assembly in which a saddle based flexible array coil is attached to a rigid base for securely holding the foot.

The foot apparatus of FIG. 13 includes some other embodiments of a rigid or half-rigid base 1206 attached to a patient table 1204. In some such embodiments, the rigid or half-rigid base 1206 resembles an ankle or foot to secure an ankle for MRI imaging. In some embodiments, multiple half-cylindrical-like configured saddle based flexible array coils 1308 are arranged on the rigid or half-rigid base 1206 and/or a cylindrical-like configured saddle based flexible array coil 1310 is arranged on the rigid or half-rigid base 1206. In some embodiments, the foot coil apparatus of FIG. 13 may also include straps for secure holding of the foot and ankle as described in FIG. 13.

Figure 14:
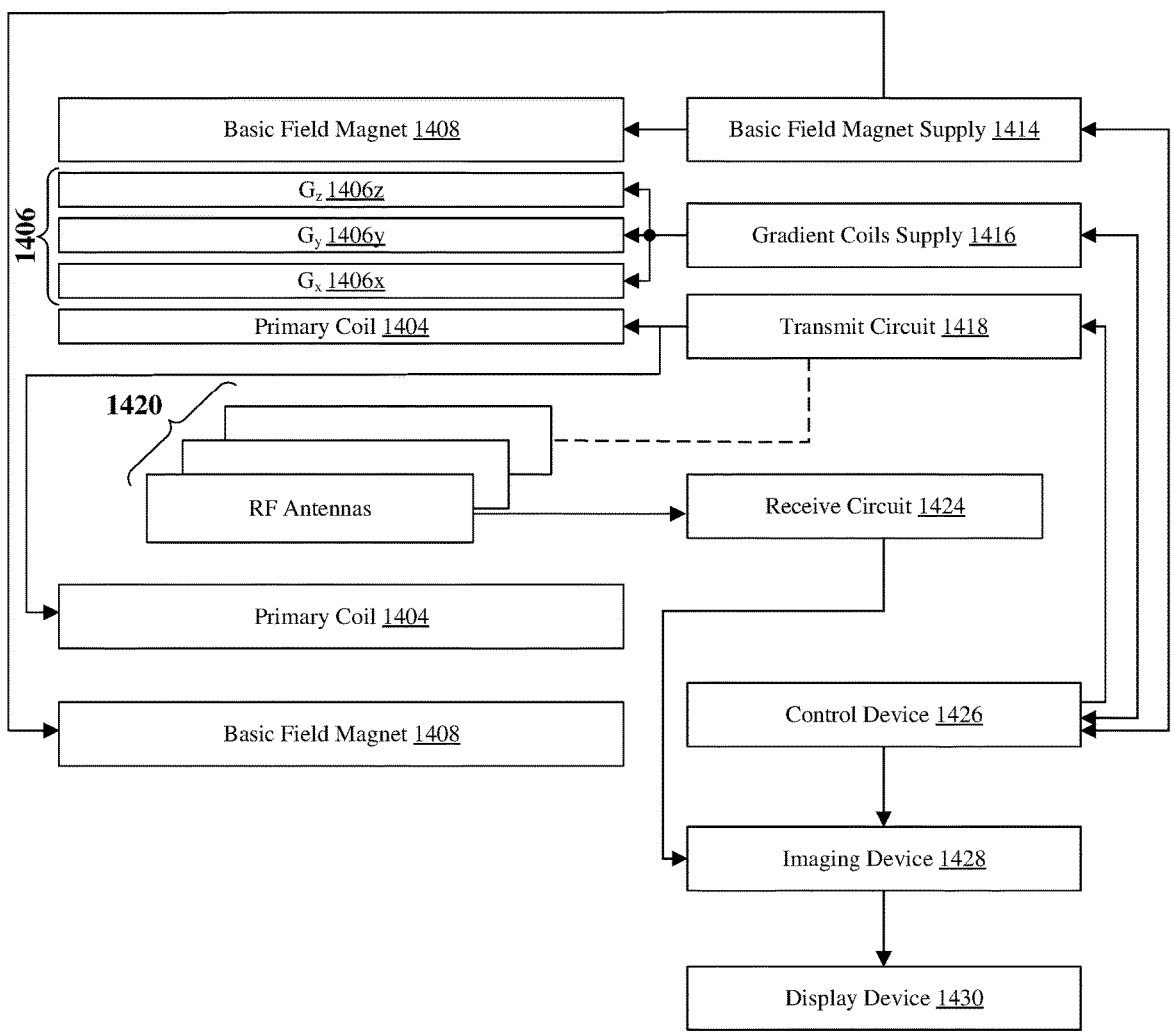
FIG. 14 illustrates a diagram of some embodiments of a magnetic resonance imaging (MRI) system.

FIG. 14 illustrates a schematic diagram of some embodiments of an MRI system 1400 that can be configured with, for example, MRI RF coils, coil channels, coil elements, coil arrays, or other circuitry according to one or more embodiments described herein.

The MRI system 1400 of FIG. 14 includes basic field magnet(s) 1408 and a basic field magnet supply 1414. Ideally, the basic field magnets 1408 would produce a uniform $B_0$ field. However, in practice, the $B_0$ field may not be uniform, and may vary over an object being imaged by the MRI system 1400. In some embodiments, the MRI system 1400 includes gradient coils 1406 configured to emit gradient magnetic fields like $G_x$ (e.g., via an associated gradient coil 1406), $G_y$ (e.g., via an associated gradient coil 1406) and $G_z$ (e.g., via an associated gradient coil 1406). The gradient coils 1406 can be controlled, at least in part, by a gradient coils supply 1416. In some examples, the timing, strength, and orientation of the gradient magnetic fields can be controlled, and thus selectively adapted during an MRI procedure.

In some embodiments, the MRI system 1400 includes a primary coil 1404 configured to generate RF pulses. In some embodiments, the primary coil 1404 is a whole body coil (WBC). In some embodiments, the primary coil 1404 comprises, for example, a birdcage coil. The primary coil 1404 can be controlled, at least in part, by a transmit circuit 1418, wherein the transmit circuit 1418 is configured to provide a signal to the primary coil 1404.

In some embodiments, the MRI system 1400 can include a set of RF antennas 1420 (e.g., one or more RF antennas). In some embodiments, the RF antennas 1420 can be configured to generate RF pulses and/or to receive resulting magnetic resonance signals from an object (e.g., a body part) to which the RF pulses are directed. A RF antenna 1420 configured solely to generate RF pulses can be referred to herein as a Tx antenna (or coil or coil array). A RF antenna 1420 configured solely to receive resulting magnetic resonance signals from an object to which the RF pulses are directed can be referred to herein as a Rx antenna (or coil or coil array). A RF antenna 1420 configured to both generate RF pulses and receive resulting magnetic resonance signals can be referred to herein as a Tx/Rx antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 1420 can be configured to inductively couple with primary coil 1404 and generate RF pulses and to receive resulting magnetic resonance signals from an object to which the RF pulses are directed. In other words, the RF antennas 1420 may be wirelessly coupled to a power source (e.g., a transmit circuit 1418) by inductive coupling with the primary coil 1404. In other embodiments, RF antennas 1420 can be wired to a power source (e.g., the transmit circuit 1418) that can drive RF antennas 1420 to generate RF pulses, and RF antennas 1420 can also be configured to receive resulting magnetic resonance signals from an object to which the RF pulses are directed. In one embodiment, one or more members of the set of RF antennas 1420 can be fabricated from flexible coaxial cable, or other conductive material. The set of RF antennas 1420 can be connected with a receive circuit 1424.

In various embodiments, a member of the set of RF antennas 1420 can be any example of the saddle based flexible array coils (e.g., FIGS. 1, 3, 6, 7A, 7B, 8, 9) described herein. In other embodiments, one, some, or all members of the set of RF antennas 1420 can be any example of a saddle coil element (e.g., 102, 104, 202, etc.) or any saddle based flexible array coil (e.g., FIGS. 1, 3, 6, 7A, 7B, 8, 9) described herein. In various embodiments, the set of RF antennas 1420 can include various combinations of example embodiments of phased array coils or saddle based flexible coil arrays according to various embodiments described herein.

The gradient coils supply 1416 and the transmit circuit 1418 can be controlled, at least in part, by a control device 1426. The magnetic resonance signals received from the set of RF antennas 1420 can be employed to generate an image, and thus can be subject to a transformation process like a two dimensional fast Fourier transform (FFT) that generates pixelated image data. The transformation can be performed by an imaging device 1028 or other similar processing device. The image data can then be shown on a display device 1430. In some embodiments, the receive circuit 1424 is connected the control device 1426 or the image device 1428.

In some embodiments, the control device 1426 can control the transmit circuit 1418 to directly drive the primary coil 1404 with a current, voltage, or a control signal. Further, the primary coil 1404 can be inductively coupled with an MRI RF coil array, such that the MRI RF coil array is driven indirectly via the primary coil 1404. In some embodiments, the control device 1426 can control the transmit circuit 1418 to drive the MRI RF coil array directly. The MRI RF coil array in either of these embodiments may, for example, be a saddle based flexible array coil (e.g., FIGS. 1, 3, 6, 7A, 7B, 8, 9) as described herein. In some embodiments, the MRI RF coil array is a whole body coil (WBC). In some embodiments, each element of the RF antennas 1420 may be individually controllable by the control device 1426. The control device 1426 can provide a DC bias current or control a DC bias control circuit to control the application of a DC bias current to the saddle based flexible array coils or saddle coil elements as described in this specification or other elements of the RF antennas 1420.

The saddle based flexible array coil (e.g., FIGS. 1, 3, 6, 7A, 7B, 8, 9) may be employed as a receive coil. Additionally, or alternatively, the saddle based flexible array coil (e.g., FIGS. 1, 3, 6, 7A, 7B, 8, 9) may be employed as a transmit coil. As discussed earlier, the saddle based flexible array coil (e.g., FIGS. 1, 3, 6, 7A, 7B, 8, 9) has improved coupling. For many cases it may have excellent decoupling among all channels. The excellent decoupling is particularly important for single layer technology (SLT). If each channel (e.g., each saddle coil element) couples to the whole-body coil (WBC) during transmit mode (Tx), the induced current from each saddle coil element will generate a uniform local Tx $B_1$ field because of the excellent decoupling.

Alternatively, T/R switches, power splitters, phase shifters, etc. can be used to drive the array coil locally because all channels are decoupled from each other very well. To avoid use of power splitters, phase shifters, etc., each channel can be independently driven in Tx mode because of the excellent decoupling. The saddle based flexible array coil (e.g., FIGS. 1, 3, 6, 7A, 7B, 8, 9) also makes a good parallel transmitter (pTx) coil. For example, in pTX, each saddle coil element is electrically coupled and driven by an individual transmit circuit 1418. As another example, in SLT, each saddle coil element inductively couples individual to the primary coil 1404 in Tx mode and each saddle coil element is electrically coupled to an individual one of the receive circuits 1424. In phase array receive mode, each coil is electrically to an individual one of the receive circuits. Alternatively, phase shifters, splitters, etc. can connect the coil elements to a common transmitter. Therefore, the saddle based flexible array coil (e.g., FIGS. 1, 3, 6, 7A, 7B, 8, 9) can be combined with SLT technology as a Tx/Rx coil.

While FIG. 14 illustrates an example MRI system 1400 that includes various components connected in various ways, it is to be appreciated that other MRI systems can include other components connected in other ways, and can be employed in connection with various embodiments discussed in this specification.

FIG. 15 illustrates a flow diagram of some embodiments of a method 1500 of conducting an MRI process using a saddle based flexible array coil comprising at least two saddle coil elements.

While the method 1500 of FIG. 15 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1502 a saddle based flexible array coil is provided that comprises a first row of at least two saddle coil elements that overlap one another in a lateral or circumferential direction. The first row of at least two saddle coil elements is configured to function in transmit and/or receive mode. FIG. 1 illustrates a schematic view 100 of some embodiments corresponding to act 1502.

At act 1504, an MRI imaging process is performed using the saddle based flexible array coil, wherein the orientation and structure of the at least two saddle coil elements reduce noise to improve reliability of the MRI imaging process.

Acts 1506-1516 provide a method of performing the MRI imaging process. At act 1506, a scan object is arranged in or proximate to the saddle based flexible array coil.

At act 1508, a $B_0$ magnetic field is applies to the scan object to align nuclei spinning in the scan object to the $B_0$ magnetic field.

At act 1510, gradient fields are applied to the scan object to select a portion of the scan object.

At act 1512, a $B_1$ magnetic field is applied to the scan object, wherein the $B_1$ magnetic field excites nuclei of the selected portion. The saddle based flexible array coil may generate the $B_1$ magnetic field and/or may receive the MRI signals.

At act 1514, MRI signals from the excited nuclei of the selected portion are received by a receive coil. The receive coil may be the saddle based flexible array coil.

At act 1516, an image of the selected portion is generated using the received MRI signals.

Therefore, the present disclosure provides a saddle based flexible array coil utilizing overlapping saddle coil elements to reduce mutual inductance and thus, noise between the overlapping saddle coil elements, thereby improving the SNR of the saddle based flexible array coil and improving the quality of the image produced by an MRI imaging process.

Accordingly, in some embodiments, the present disclosure relates to a flexible magnetic resonance imaging (MRI) radio frequency (RF) array coil configured to operate in at least one of a transmit (Tx) mode or a receive (Rx) mode, the flexible MRI RF array coil comprising: a first row of saddle coil elements comprising at least a first saddle coil element and a second saddle coil element, wherein the first and second saddle coil elements partially overlap with one another, and wherein the first and second saddle coil elements each comprise a left loop and a right loop coupled to the left loop by two connection segments.

In other embodiments, the present disclosure relates to a magnetic resonance imaging (MRI) system comprising: a saddle based flexible array coil that comprises: a first row of saddle coil elements, wherein the first row of saddle coil elements includes a plurality of first-row saddle coil elements overlapping one another circumferentially around an axis, wherein each of the first-row saddle coil elements comprises a pair of loops and a pair of connection segments, wherein the loops of the pair are separated from each other circumferentially around the axis, and wherein the connection segments interconnect the loops and cross each other between the loops.

In yet other embodiments, the present disclosure relates to a method comprising: providing saddle based flexible array coil for magnetic resonance imaging (MRI) comprising: a first row of saddle coil elements, wherein the first row comprises at least two saddle coil elements, wherein the at least two saddle coil elements partially overlap with one another, and wherein each saddle coil element has a pair of loops coupled to one another by a pair of connection segments; and performing an MRI imaging process on a scan target using the saddle based flexible array coil in a receive (Rx) mode and/or a transmit (Tx) mode, wherein the loops of each saddle coil element are spaced far apart from one another to increase a signal-to-noise (SNR) ratio of the MRI imaging process.

The following includes definitions of selected terms employed herein. The definitions include various examples or forms of components that fall within the scope of a term and that may be used for implementation. The examples are not intended to be limiting. Both singular and plural forms of terms may be within the definitions.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the above description some components may be displayed in multiple figures carrying the same reference signs, but may not be described multiple times in detail. A detailed description of a component may then apply to that component for all its occurrences.

The detailed descriptions presented herein may be presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example MRI RF coils, coils, circuits, apparatus, systems, methods, operations, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A flexible magnetic resonance imaging (MRI) radio frequency (RF) array coil configured to operate in at least one of a transmit (Tx) mode or a receive (Rx) mode, the flexible MRI RF array coil comprising:
    a first row of saddle coil elements comprising at least a first saddle coil element and a second saddle coil element, wherein the first and second saddle coil elements partially overlap with one another, wherein the first and second saddle coil elements each comprise a left loop and a right loop coupled to the left loop by two connection segments, and wherein the left loop of the second saddle coil element surrounds and demarcates an area overlapping with and bordering the two connection segments of the first saddle coil element.

2. The flexible MRI RF array coil of claim 1, wherein the right loop of the second saddle coil element overlaps with and borders both the left and right loops of the first saddle coil element.

3. The flexible MRI RF array of claim 1, wherein the two connection segments cross only once between the left and right loops.

4. The flexible MRI RF array of claim 1, wherein the first row of saddle coil elements has a flat profile.

5. The flexible MRI RF array of claim 1, further comprising:
a second row of saddle coil elements comprising at least a third saddle coil element and a fourth saddle coil element, wherein the third and fourth saddle coil elements partially overlap with one another, wherein the second row of saddle coil elements partially overlaps with the first row of saddle coil elements in a $B_0$ direction, and wherein the third and fourth saddle coil elements each comprise a left loop and a right loop coupled to the left loop by two connection segments.

6. The flexible MRI RF array of claim 5, wherein a total number of saddle coil elements in the second row is different than a total number of saddle coil elements in the first row.

7. The flexible MRI RF array of claim 5, wherein a total number of saddle coil elements in the second row is equal to a total number of saddle coil elements in the first row.

8. The flexible MRI RF array coil of claim 1, wherein the two connection segments of the first saddle coil element cross each other at a point, and wherein the left loop of the second saddle coil element surrounds the point.

9. The flexible MRI RF array coil of claim 1, wherein the left loop of the second saddle coil element further overlaps with and borders both the left and right loops of the first saddle coil element.

10. A magnetic resonance imaging (MRI) system comprising:
a saddle based flexible array coil that comprises:
a first row of saddle coil elements, wherein the first row of saddle coil elements includes a plurality of first-row saddle coil elements overlapping one another circumferentially around an axis, wherein each of the first-row saddle coil elements comprises a pair of loops and a pair of connection segments, wherein the loops of the pair are separated from each other circumferentially around the axis, wherein the connection segments interconnect the loops and cross each other between the loops, wherein the plurality of first-row saddle coil elements comprises a first first-row saddle coil element, and wherein each of the loops of the first first-row saddle coil element has two or more turns.

11. The MRI system according to claim 10, wherein each of the loops of the plurality of first-row saddle coil elements has two or more turns.

12. The MRI system according to claim 10, wherein a first loop of the pair faces a second loop of the pair, and wherein the axis is arranged directly between the first loop and the second loop.

13. The MRI system according to claim 10, wherein the saddle based flexible array coil is in a cylindrical configuration.

14. The MRI system according to claim 10, wherein the saddle based flexible array coil is half cylindrical-like.

15. The MRI system according to claim 10, wherein the connection segments cross each other at a point surrounded by a loop of a neighboring first-row saddle coil element.

16. The MRI system according to claim 10, further comprising:
a rigid or half-rigid base structure configured to surround a torso, a knee, a leg, a foot, a shoulder, an arm, a wrist, or a head, wherein the saddle based flexible array coil is fixed to the rigid or half-rigid base structure.

17. The MRI system of claim 16, further comprising:
flexible straps fixed to the saddle based flexible array coil and configured to hold the saddle based flexible array coil in place during imaging of the torso, the knee, the leg, the foot, the shoulder, the arm, the wrist, or the head.

18. A method comprising:
providing a saddle based flexible array coil for magnetic resonance imaging (MRI) comprising: a first row of saddle coil elements, wherein the first row comprises at least two saddle coil elements, wherein the at least two saddle coil elements partially overlap with one another and comprise a first saddle coil element and a second saddle coil element, wherein each saddle coil element has a pair of loops, including a first loop, coupled to one another by a pair of connection segments, wherein the first loop of the second saddle coil element overlaps with and borders a side of the first loop of the first saddle coil element from which the pair of connection segments of the first saddle coil element extend, and pwherein the pair of connection segments of the first saddle coil element extend along the first row; and
performing an MRI imaging process on a scan target using the saddle based flexible array coil in a receive (Rx) mode and/or a transmit (Tx) mode, wherein the loops of each saddle coil element are spaced far apart from one another to increase a signal-to-noise (SNR) ratio of the MRI imaging process.

19. The method of claim 18, further comprising:
wrapping the saddle based flexible array coil around the scan target, wherein the scan target is a human body part; and
using flexible straps to secure the saddle based flexible array coil around the scan target before performing the MRI imaging process.

20. The method of claim 18, wherein the pair of connection segments of the first saddle coil element cross each other at a point, and wherein the first loop of the second saddle coil element surrounds the point.

* * * * *